(12) United States Patent
Fong et al.

(10) Patent No.: US 6,526,540 B1
(45) Date of Patent: Feb. 25, 2003

(54) FLIP CHIP TRACE LIBRARY GENERATOR

(75) Inventors: Eric Fong, Cupertino, CA (US); Thinh Tran, San Jose, CA (US); Mike Teh-An Liang, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 131 days.

(21) Appl. No.: 09/756,506

(22) Filed: Jan. 8, 2001

(51) Int. Cl.$^7$ .............................................. G06F 17/50
(52) U.S. Cl. ................................. 716/1; 716/3
(58) Field of Search ........................ 716/1, 3

(56) References Cited

U.S. PATENT DOCUMENTS 5,877,833 A * 3/1999 Schraivogel et al. ........ 257/735
6,321,367 B1 * 11/2001 Chun et al. .................... 716/11

OTHER PUBLICATIONS

Shenoy et al, "Flip Chip Package Design Optimization", IEEE, 1999.*

* cited by examiner

Primary Examiner—Vuthe Siek
Assistant Examiner—Brandon Bowers
(74) Attorney, Agent, or Firm—Fitch, Even, Tabin & Flannery

(57) ABSTRACT

A method of generating a trace library includes the steps of receiving as inputs a plurality of technology dependent parameters and a trace template and generating a trace layout from the inputs.

3 Claims, 3 Drawing Sheets

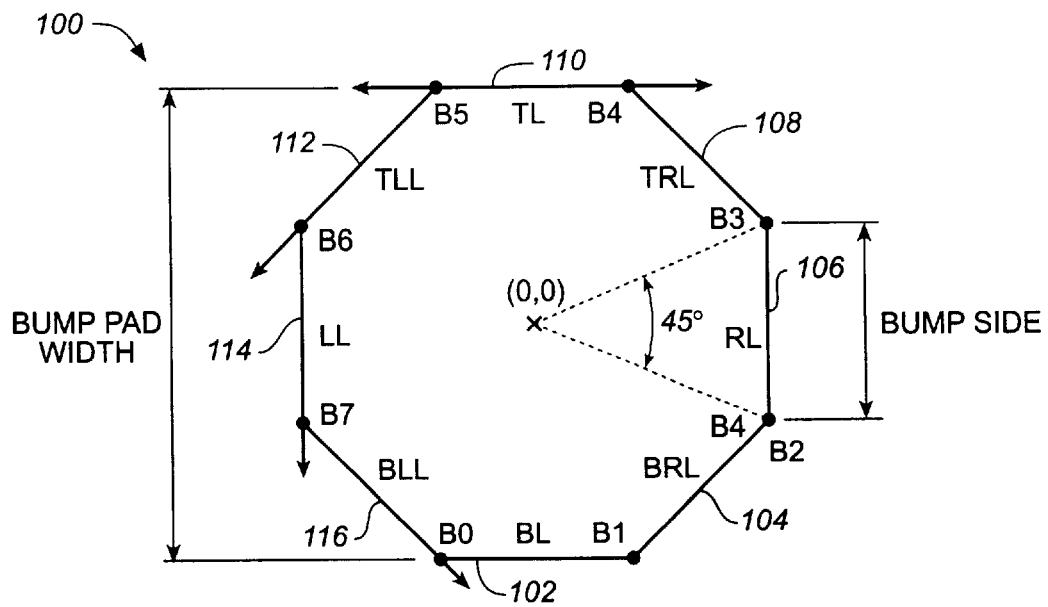
FIG._1
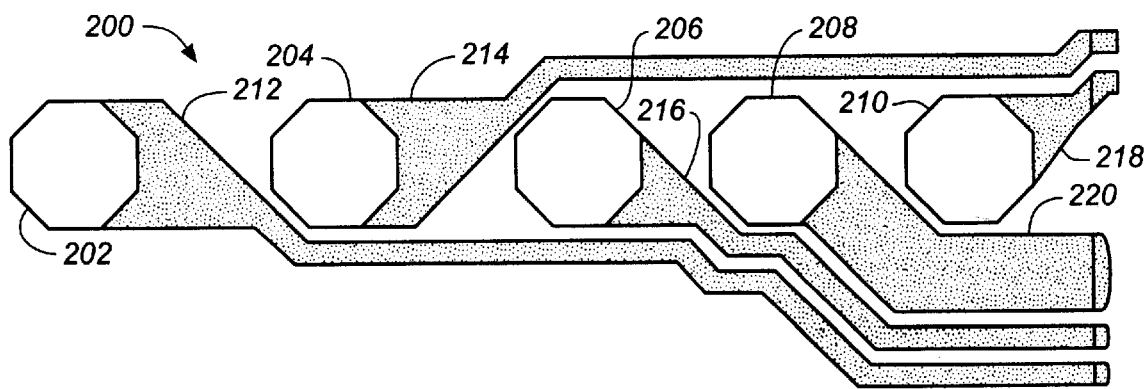
FIG._2

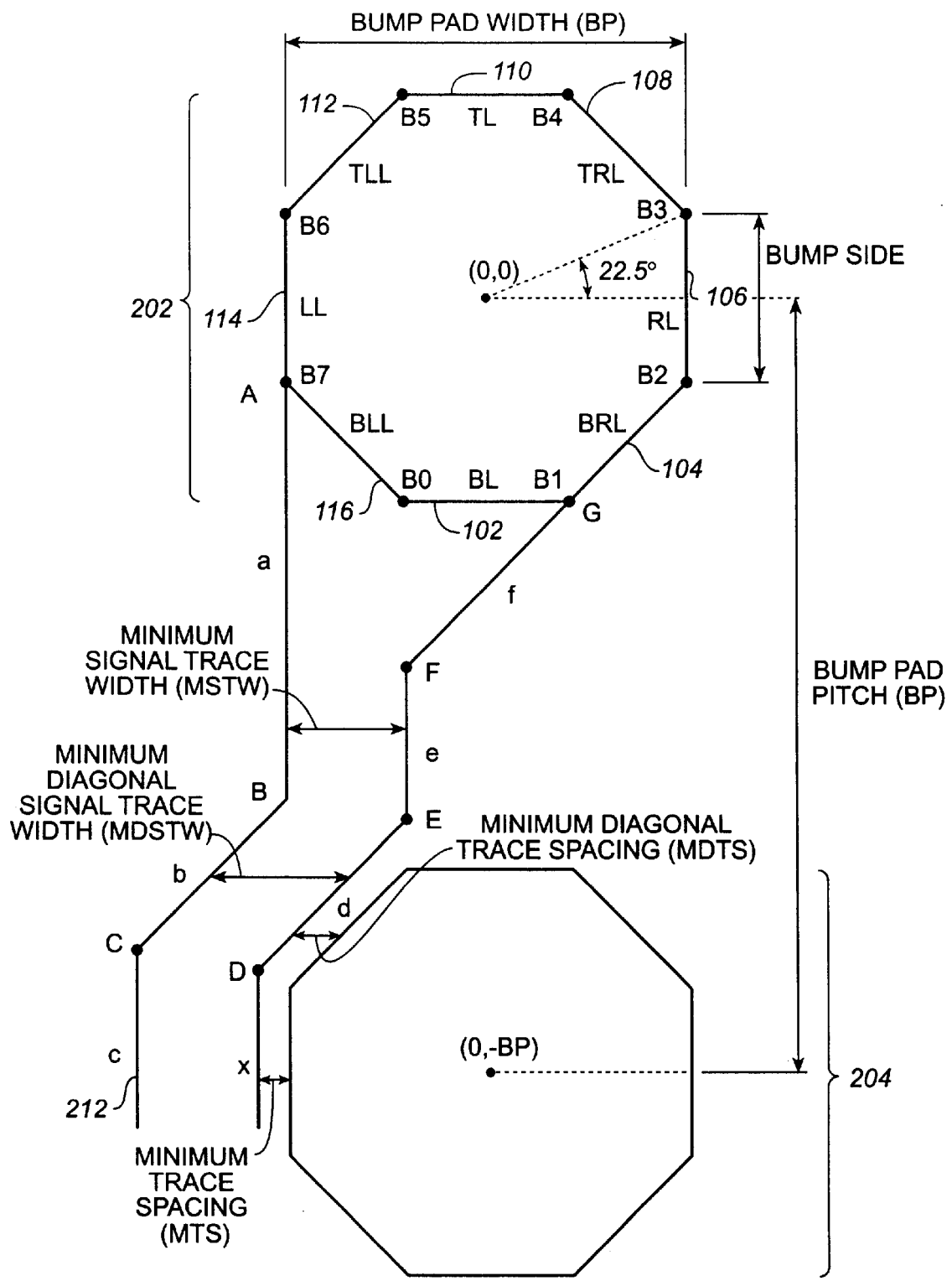
FIG._3

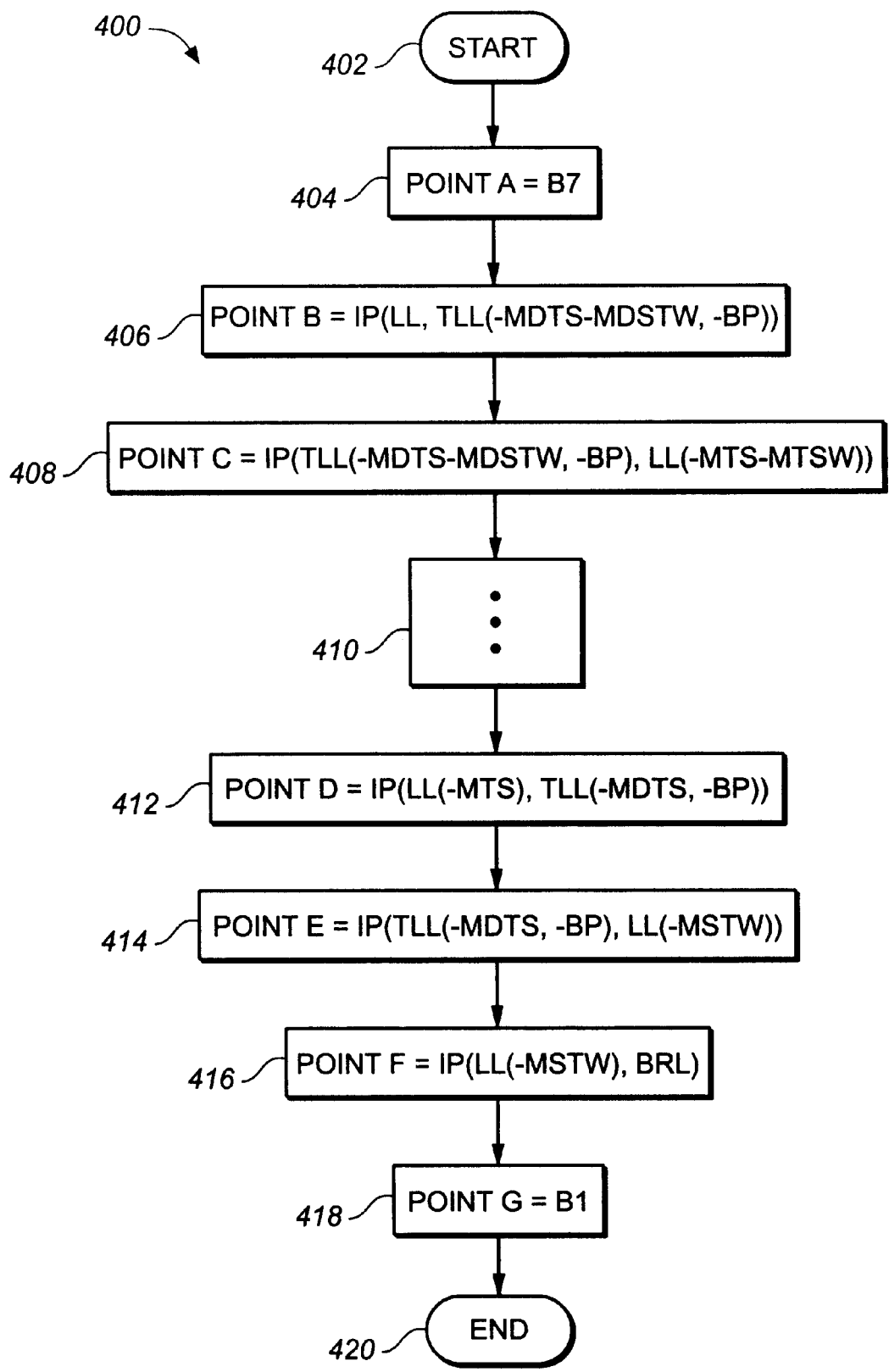
FIG._4

FLIP CHIP TRACE LIBRARY GENERATOR

BACKGROUND OF THE INVENTION

The present invention relates generally to trace routing techniques for integrated circuits. More specifically, but without limitation thereto, the present invention relates to generating a trace library for a flip chip ball grid array package.

Trace libraries for flip chip bump and trace layouts are currently generated manually in a mask level graphics editor. Trace layouts are typically stored in a standard data format for later recall. A trace library generally requires more than two weeks of effort by an experienced computer aided drafting (CAD) designer to build and verify. The process of drawing traces is tedious and error prone, and each of the many traces must follow strict spacing rules. For each new flip chip technology, new trace libraries are required for each bump pitch. For three bump pitches, for example, three trace libraries must be generated. Also, every time any of several other technology dependent parameters (TDP) change, the trace layouts previously drawn must be revisited and new trace libraries generated.

SUMMARY OF THE INVENTION

The present invention advantageously addresses the problems above as well as other problems by providing a method and a computer program for generating and updating trace libraries automatically.

In one embodiment, the invention may be characterized as a method of generating a trace library that includes the steps of receiving as inputs a plurality of technology dependent parameters and a trace template and generating a bump and trace layout from the inputs.

The features and advantages summarized above in addition to other aspects of the present invention will become more apparent from the description, presented in conjunction with the following drawings.

BRIEF DESCRIPTION OF THE DRAWINGS

The above and other aspects, features and advantages of the present invention will be more apparent from the following more specific description thereof, presented in conjunction with the following drawings wherein:

FIG. 1 is a diagram of a bump pad model used to create a trace template according to an embodiment of the present invention;

FIG. 2 is a bump and trace layout of a routing tile to be generated using the bump pad model of FIG. 1;

FIG. 3 is a diagram illustrating an example of how to generate a trace layout for FIG. 2; and FIG. 4 is a flow chart for generating the trace layout of FIG. 3.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

FIG. 1 is a diagram of a bump pad model 100 used to create a trace template. Shown are line segments enclosing a bump pad area consisting of a bottom line (BL) 102, a bottom right line (BRL) 104, a right line (RL) 106, a top right line (TRL) 108, a top line (TL) 110, a top left line (TLL) 112, a left line (LL) 114, a bottom left line (BLL) 116, and points B0–B7. The points B0–B7 are defined by the intersections of the line segments. In this example, an octagonal outline is used to define the structure of the bump pad model 100, however other geometries may be used to define the structure of the bump pad model 100 for specific applications.

An important feature of the embodiment shown in FIG. 1 is that the structure of the bump pad model 100 does not include any fixed technology dependent values. By incorporating the structure of the bump pad model 100 in a set of trace definition formulas, the formulas need not be changed to adapt to various technologies. For example, point B7 may be expressed relative to the center of the bump pad model 100 by an X-Y offset expressed as a function of the bump pad width (BPW), i.e., $$B7 = (-BPW/2, -BPW \times \tan 22.5°) \quad (1)$$

The minus signs indicate that the X-offset is left and the Y-offset is down relative to the bump pad origin (0, 0). Point B7 may thus be substituted in a trace definition formula without a specific value of the technology dependent bump pad width (BPW), as will be explained in the example below.

FIG. 2 is a bump and trace layout 200 of a routing tile to be generated using the bump pad model of FIG. 1. Shown are bump pads 202, 204, 206, 208, and 210, signal traces 212, 214, 216, and 218, and a power trace 220. The bump pads 202, 204, 206, 208, and 210 in this example are in a single line and are separated by a distance between centers called the bump pitch. The signal traces 212, 214, 216, and 218 and the power trace 220 are packed closely against the bump pads 202, 204, 206, 208, and 210 as shown. The signal traces 212, 214, 216, and 218 have a minimum signal trace width and the power trace 220 has a minimum power trace width. Also, there is a minimum trace spacing. The bump pad width (BPW), the bump pitch (BP), the minimum signal trace width (MSTW), the minimum power trace width (MPTW), and the minimum trace spacing (MTS) may be stored in a file of technology dependent parameters (TDP) for calculating specific dimensions for a bump and trace layout automatically from a trace template file that describes the bump and trace layout by formulas expressed as functions of the technology dependent parameters. The technology dependent parameter (TDP) file may also include other parameters such as minimum diagonal trace spacing (MDTS), minimum diagonal signal trace width (MDSTW), and minimum diagonal power trace width (MDPTW).

Once a trace template file is created, the bump and trace layout may be adapted to different technologies simply by updating the technology dependent parameters in the technology dependent parameter file and regenerating the bump and trace layout from the same trace template file.

FIG. 3 is a diagram illustrating an example of how to generate a trace layout for FIG. 2 from a sequence of points. Shown in FIG. 3 are the bump pads 202 and 204 and a sequence of points A–G connected by lines a–g that enclose a portion of the signal trace 212. Point A is the same as point B7 defined by formula (1) above. Point A may also be defined as the intersection point (IP) of the left line (LL) 114 and the bottom left line (BLL) 116:

$$A = B7 = IP(LL, BLL) \quad (2)$$

Point A is connected by line a to Point B. Point B is defined by the intersection of line a and line b. Line b may be defined as the top left line (TLL) 112 with a Y-offset of minus one bump pitch (BP) and an X-offset of minus one minimum diagonal trace spacing (MDTS) minus one minimum diagonal signal trace width (MDSTW). Because the direction of the Y-offset is down and the direction of the X-offset is left, both offsets are expressed as negative values:

$$b=TLL(-MDTS-MDSTW, -BP) \quad (3)$$

Point B may then be expressed as the intersection point of line a and line b:

$$B=IP(LL, TLL(-MDTS-MDSTW, -BP)) \quad (4)$$

Point B is connected by line b to point C. Point C is defined by the intersection of line b and line c. Line c may be defined as the left line (LL) 114 with an X-offset of minus the minimum trace spacing (MTS) minus the minimum signal trace width (MSTW). Because LL is a vertical line, the Y-offset has no meaning, thus only the X-offset is used:

$$c=LL(-MTS-MTSW) \quad (5)$$

Point C may then be expressed as the intersection point of line b and line c:

$$C=IP(TLL(-MDTS-MDSTW, -BP), LL(-MTS-MTSW)) \quad (6)$$

Point C is connected by a similar series of points and lines, omitted for the sake of simplifying the example, to point D. Point D is defined by the intersection of line x and line d. Line x may be defined as the left line (LL) 114 with an X-offset of minus the minimum trace spacing (MTS):

$$x=LL(-MTS) \quad (7)$$

Line d may be defined as the top left line (TLL) 112 with an X-offset of minus one minimum diagonal trace spacing (MDTS) and a Y-offset of minus one bump pitch:

$$d=TLL(-MDTS, -BP) \quad (8)$$

Point D may then be expressed as the intersection point of line x and line d:

$$D=IP(LL(-MTS), TLL(-MDTS, -BP)) \quad (9)$$

Point D is connected by line d to point E. Point E is defined by the intersection of line d and line e. Line e may be defined as the left line (LL) 114 with an X-offset of the minimum signal trace width (MSTW):

$$e=LL(MSTW) \quad (10)$$

Because the X-offset is now to the right, the X-offset is positive. Point E may then be expressed as the intersection point of line d and line e:

$$E=IP(TLL(-MDTS, -BP), LL(MSTW)) \quad (11)$$

Point E is connected by line e to point F. Point F is defined by the intersection of line e and line f. Line f may be defined as the bottom right line (BRL) 104 with no offset:

$$f=BRL \quad (12)$$

Point F may then be expressed as the intersection point of line e and line f:

$$F=IP(LL(MSTW), BRL) \quad (13)$$

Point F is connected by line f to point G. Point G is the same as point B1, and the sequence of points enclosing the signal trace 212 is terminated.

FIG. 4 is a flow chart 400 for generating the trace layout of FIG. 3. Step 402 is the entry point. Step 404 defines the first point in the trace sequence, point A. Step 406 defines the next point B in the trace sequence, the intersection of line a and line b. Step 408 defines the next point C in the trace sequence, the intersection of line b and line c. Step 410 represents a series of similar steps until the point D in the trace sequence. Step 412 defines the next point D in the trace sequence, the intersection of line x and line d. Step 414 defines the next point E in the trace sequence, the intersection of line d and line e. Step 416 defines the next point F in the trace sequence, the intersection of line e and line f. Step 418 defines the last point G in the trace sequence, point B1. Step 420 is the exit point.

Table 1 is a computer listing of a trace template for the example of the trace in FIG. 3, where SET_P is a macro instruction for defining the coordinates of a point, LINE is a macro instruction for defining a line extending through two points, ADD_P is a macro instruction for adding a point to the trace sequence, and ADD_IP is a macro instruction for adding an intersection point of two lines to the trace sequence. To reduce the number of repetitive keystrokes, PR provides a copy of the last operand in the previous instruction.

As may be appreciated from Table 1, a trace template may be generated in a highly compact form that may readily be inspected and edited. On the other hand, changes in the technology dependent parameters (TDP) may be made and a new trace layout may be generated from the trace template without necessitating any changes to the trace template.

TABLE 1

```
//          describe the bump structure from the TDP
            DEFINE HALFBPW   (BPW/2);
            DEFINE HALFBPS   (BPW * TAN 22.5);
            SET_P B0 (-HALFBPS, -HALFBPW);
            SET_P B1 (HALFBPS, -HALFBPW);
            SET_P B2 (HALFBPW, -HALFBPS);
            SET_P B3 (HALFBPW, HALFBPS);
            SET_P B4 (HALFBPS, HALFBPW);
            SET_P B5 (-HALFBPS, HALFBPW);
            SET_P B6 (-HALFBPW, HALFBPS);
            SET_P B7 (-HALFBPW, -HALFBPS);
            LINE BL (B0, B1);
            LINE BRL (B1, B2);
            LINE RL (B2, B3);
            LINE TRL (B3, B4);
            LINE TL (B4, B5);
            LINE TLL (B5, B6);
            LINE LL (B6, B7);
            LINE BLL (B7, B0);
// describe the trace layout from the bump structure and the TDP
            TRACE FIG3
            ADD_P B7;
            ADD_IP LL, TLL(-MDTS-MDSTW, -BP);
            ADD_IP PR, LL(-MTS-MTSW);
//          . . .
            ADD_IP PR, TLL(-MDTS, -BP);
            ADD_IP PR, LL(-MSTW);
            ADD_IP PR, BRL;
            ADD_P B1;
            END
```

Other modifications, variations, and arrangements of the present invention may be made in accordance with the above teachings other than as specifically described to practice the invention within the spirit and scope defined by the following claims.

What is claimed is:

1. A method of generating a trace library comprising:
   receiving as inputs a plurality of technology dependent parameters and a trace template; and generating a trace layout from the inputs wherein the trace template comprises a bump structure description and a trace layout description and wherein the trace layout description comprises an area enclosed by line segments between a sequence of points defined from the bump structure description and X-Y offsets.

2. The method of claim 1 wherein the X-Y offsets are calculated from the technology dependent parameters.

3. The method of claim 1 wherein the X-Y offsets are expressed as a function of the bump pad width.

* * * * *